United States Patent
Shin et al.

(10) Patent No.: US 9,577,132 B2
(45) Date of Patent: Feb. 21, 2017

(54) SOLAR CELL MODULE

(71) Applicant: LG Electronics Inc., Seoul (KR)

(72) Inventors: Myungjun Shin, Seoul (KR); Haejong Cho, Seoul (KR); Minho Choi, Seoul (KR); Seongeun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 208 days.

(21) Appl. No.: 14/263,682

(22) Filed: Apr. 28, 2014

(65) Prior Publication Data

US 2014/0230881 A1    Aug. 21, 2014

Related U.S. Application Data

(63) Continuation of application No. 13/342,624, filed on Jan. 3, 2012, now Pat. No. 8,729,384.

(30) Foreign Application Priority Data

Jan. 4, 2011 (KR) .................. 10-2011-0000380

(51) Int. Cl.
*H01L 31/0224*    (2006.01)
*H01L 31/05*      (2014.01)
*H01L 31/068*     (2012.01)

(52) U.S. Cl.
CPC ... *H01L 31/0504* (2013.01); *H01L 31/022441* (2013.01); *H01L 31/0516* (2013.01); *H01L 31/0682* (2013.01); *Y02E 10/547* (2013.01)

(58) Field of Classification Search
CPC .................. H01L 31/0504; H01L 31/022441; H01L 31/0516; H01L 31/0682
USPC ........................................... 136/244
See application file for complete search history.

(56) References Cited

U.S. PATENT DOCUMENTS

2005/0268959 A1* 12/2005 Aschenbrenner ... H01L 31/0516
                                                    136/244
2010/0139746 A1   6/2010 Von Maydell et al.

FOREIGN PATENT DOCUMENTS

| DE | 102007013553 A1 | 9/2008 |
|----|-----------------|--------|
| DE | 102007035883 A1 | 2/2009 |
| JP | 2004200515 A    | 7/2004 |
| JP | 2005-11869 A    | 1/2005 |
| JP | 2006-120945 A   | 5/2006 |
| JP | 2010-016246     | * 1/2010 |

(Continued)

OTHER PUBLICATIONS

Van Kerschaver e. et al., "Back-contact Solar Cells: A Review", Progress in Photovoltaics. Research and Applications, John wiley and Sons, Chichester, GB, vol. 14, No. 2, Mar. 1, 2006 (Mar. 1, 2006), pp. 107-123, XP002577679.

*Primary Examiner* — Jayne Mershon
(74) *Attorney, Agent, or Firm* — Dentons US LLP

(57) ABSTRACT

A solar cell module includes a plurality of solar cells each including a substrate, an emitter region positioned at a back surface of the substrate, first electrodes electrically connected to the emitter region, second electrodes electrically connected to the substrate, a first current collector positioned at ends of the first electrodes, and a second current collector at ends of the second electrodes, and a first connector connecting a first current collector of a first solar cell of the plurality of solar cells to a second current collector of a second solar cell adjacent to the first solar cell. The first current collector of the first solar cell and the second current collector of the second solar cell each have a different polarity.

21 Claims, 11 Drawing Sheets

(56) References Cited

FOREIGN PATENT DOCUMENTS

| | | |
|---|---|---|
| JP | 2010016246 A | 1/2010 |
| KR | 1020100064478 A | 6/2010 |
| WO | 2008078741 A1 | 7/2008 |
| WO | 2008080160 A1 | 7/2008 |
| WO | 2009025147 A1 | 2/2009 |
| WO | 2009147890 A1 | 12/2009 |
| WO | 2010001927 A1 | 1/2010 |

* cited by examiner

SOLAR CELL MODULE

This is a continuation of U.S. application Ser. No. 13/342,624 filed Jan. 3, 2012 and claims the priority to and benefits of Korean Patent Application No. 10-2011-0000380 filed in the Korean Intellectual Property Office on Jan. 4, 2011, the entire contents of which are incorporated by reference for all purposes as if fully setforth herein.

BACKGROUND

Field of the Disclosure

Embodiments of the disclosure relate to a solar cell module.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes a substrate and an emitter region, each of which is formed of a semiconductor, and electrodes respectively formed on the substrate and the emitter region. The semiconductors forming the substrate and the emitter region have different conductive types, for example, a p-type and an n-type. A p-n junction is formed at an interface between the substrate and the emitter region.

When light is incident on the solar cell, a plurality of electron-hole pairs are produced in the semiconductors. The electron-hole pairs are separated into electrons and holes by photovoltaic effect. The separated electrons move to the n-type semiconductor (e.g., the emitter region), and the separated holes move to the p-type semiconductor (e.g., the substrate). Then, the electrons and holes are collected by the electrodes electrically connected to the emitter region and the substrate, respectively. The electrodes are connected to each other using electric wires to thereby obtain electric power.

SUMMARY

In one aspect, there is a solar cell module including a plurality of solar cells each including a substrate, an emitter region which is positioned at a back surface of the substrate and forms a p-n junction along with the substrate, first electrodes electrically connected to the emitter region, second electrodes electrically connected to the substrate, the first electrodes and the second electrodes being alternately disposed to be spaced apart from each other, a first current collector which is positioned in a direction crossing the first electrodes and connects the first electrodes to one another, and a second current collector which is positioned in a direction crossing the second electrodes and connects the second electrodes to one another, and a first connector configured to connect a first current collector of a first solar cell of the plurality of solar cells to a second current collector of a second solar cell adjacent to the first solar cell, the first current collector of the first solar cell and the second current collector of the second solar cell each having a different polarity, wherein at least one of the first current collector of the first solar cell and the second current collector of the second solar cell includes a portion having a first width and a portion having a second width less than the first width. The first current collector may be positioned at ends of the first electrodes and the second current collector may be positioned at ends of the second electrodes. The first current collector of the first solar cell and the second current collector of the second solar cell may be disposed in a straight line.

The first connector may be disposed to overlap the first current collector of the first solar cell and the second current collector of the second solar cell in a longitudinal direction.

A width of a first end, which is adjacent to the second current collector of the second solar cell, among both ends of the first current collector of the first solar cell may be greater than a width of a remaining second end of the first current collector of the first solar cell.

As the first current collector of the first solar cell goes from the second end to the first end of the first current collector, a width of the first current collector may gradually increase.

A width of a first end, which is adjacent to the first current collector of the first solar cell, among both ends of the second current collector of the second solar cell may be greater than a width of a remaining second end of the second current collector of the second solar cell.

As the second current collector of the second solar cell goes from the second end to the first end of the second current collector, a width of the second current collector may gradually increase.

A width of a middle portion of the first connector, which overlaps the first end of the first current collector of the first solar cell and the first end of the second current collector of the second solar cell, may be greater than a width of each of both ends of the first connector.

As the first connector goes from the both ends to the middle portion of the first connector, a width of the first connector may gradually increase.

A thickness of the middle portion of the first connector may be greater than a thickness of each of the both ends of the first connector.

As the first connector goes from the both ends to the middle portion of the first connector, a thickness of the first connector may gradually increase.

The plurality of solar cells may include a third solar cell, which is positioned adjacent to the second solar cell on the opposite side of the first solar cell. A second current collector of the third solar cell and a first current collector of the second solar cell may be disposed in a straight line.

The solar cell module may further include a second connector, which is disposed to overlap the first current collector of the second solar cell and the second current collector of the third solar cell in a longitudinal direction.

The first connector may be a conductive film. The first connector may be a flexible material.

A width of a portion of the first current collector, which is physically connected to the first electrodes, in at least one of the plurality of solar cells may be greater than a width of a portion of the first current collector, which is not physically connected to the first electrodes. Alternatively, a width of a portion of the second current collector, which is physically connected to the second electrodes, in the at least one solar cell may be greater than a width of a portion of the second current collector, which is not physically connected to the second electrodes.

The first current collector or the second current collector in at least one of the plurality of solar cells may have a curved surface in a portion of the first current collector or the second current collector physically connected to the first electrodes or the second electrodes.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. Attention should be paid that detailed description of known arts will be omitted if it is determined that the arts does not further the understanding of the embodiments of the invention.

Hereinafter, a solar cell module according to embodiments of the invention and a method for manufacturing the same are described with reference to FIGS. 1 to 12.

First, a solar cell according to a first embodiment of the invention is described in detail with reference to FIGS. 1 and 2.

Figure 1:
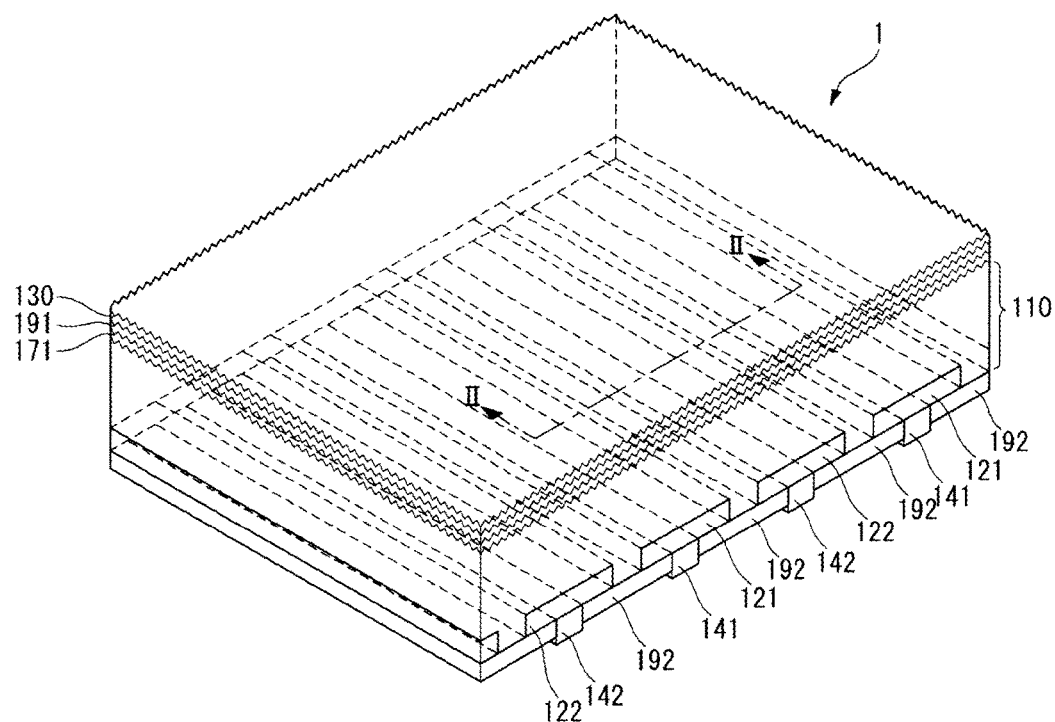
FIGS. 1 and 2 illustrate a solar cell according to a first embodiment of the invention.

FIG. 1 is a partial perspective view of a solar cell according to a first embodiment of the invention. FIG. 2 is a cross-sectional view taken along line II-II of FIG. 1.

Figure 2:
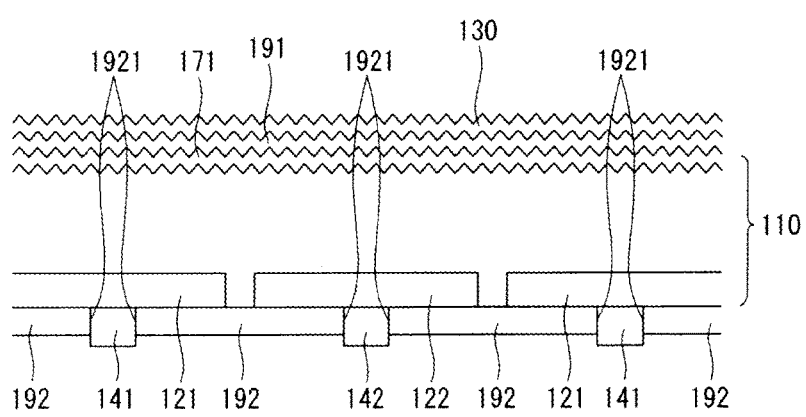

As shown in FIGS. 1 and 2, a solar cell 1 according to the first embodiment of the invention may include a substrate 110, a front surface field (FSF) region 171, a front passivation layer 191, an anti-reflection layer 130, a plurality of emitter regions 121, a plurality of back surface field (BSF) regions 122, a back passivation layer 192, a plurality of first electrodes 141, and a plurality of second electrodes 142.

In the embodiment of the invention, the FSF region 171, the front passivation layer 191, the anti-reflection layer 130, the BSF regions 122, and the back passivation layer 192 may be omitted. Even if the above components are omitted, the solar cell 1 according to the embodiment of the invention may perform its original photoelectric conversion operation. As shown in FIGS. 1 and 2, when the solar cell 1 includes the FSF region 171, the front passivation layer 191, the anti-reflection layer 130, the BSF regions 122, and the back passivation layer 192, the photoelectric conversion efficiency of the solar cell 1 is further improved. Therefore, in the following description, the embodiment of the invention describes the solar cell including the FSF region 171, the front passivation layer 191, the anti-reflection layer 130, the BSF regions 122, and the back passivation layer 192 as an example.

The substrate 110 is a semiconductor substrate formed of first conductive type silicon, for example, n-type silicon, though not required. For example, the substrate 110 may be formed of crystalline silicon such as single crystal silicon and polycrystalline silicon. In this instance, because the substrate 110 is of an n-type, the substrate 110 may contain impurities of a group V element such as nitrogen (N), phosphorus (P), arsenic (As), antimony (Sb), and bismuth (Bi).

Alternatively, the substrate 110 may be of a p-type. In this instance, the substrate 110 may contain impurities of a group III element such as boron (B), aluminum (Al), gallium (Ga), indium (In), and titanium (Ti).

A front surface of the substrate 110 is textured to form a textured surface corresponding to an uneven surface or having uneven characteristics. A light reflectance of the front surface of the substrate 110 is reduced because of the textured front surface of the substrate 110. Further, because light incident and reflective operations are performed several times on the textured surface of the substrate 110, the light is confined in the solar cell 1. As a result, an absorptance of light increase, and the efficiency of the solar cell 1 is improved.

The FSF region 171 is positioned at the front surface of the substrate 110 on which light is incident. For example, the FSF region 171 is a region (for example, an $n^+$-type region) which is more heavily doped than the substrate 110 with impurities of the same conductive type as the substrate 110.

A potential barrier is formed by a difference between impurity concentrations of the substrate 110 and the FSF region 171, thereby preventing carriers (for example, holes) from moving to the front surface of the substrate 110. Hence, the recombination and/or the disappearance of electrons and holes around the front surface of the substrate 110 is prevented or reduced.

The front passivation layer 191 is positioned on the FSF region 171 and converts a defect, for example, dangling bonds existing at and around the surface of the substrate 110 into stable bonds, thereby preventing or reducing a recombination and/or a disappearance of carriers (for example, electrons) moving to the front surface of the substrate 110. The front passivation layer 191 may be formed of silicon oxide ($SiO_x$). However, other materials may be used.

The anti-reflection layer 130 is positioned on the front passivation layer 191 and may be formed of hydrogenated silicon nitride (SiNx:H). However, other materials may be used. The anti-reflection layer 130 reduces a reflectance of light incident on the solar cell 1 and in some embodiments, increases selectivity of a predetermined wavelength band, thereby increasing the efficiency of the solar cell 1. In the embodiment of the invention, the anti-reflection layer 130 has a single-layered structure, but in some embodiments, may have a multi-layered structure, for example, a double-layered structure. The anti-reflection layer 130 may be omitted in some embodiments.

The plurality of emitter regions 121 are positioned at a back surface opposite the front surface of the substrate 110 to be spaced apart from one another and extend in a direction parallel to one another. Each of the emitter regions 121 is a region (for example, a p$^{++}$-type region) which is heavily doped with impurities of a second conductive type (for example, a p-type) opposite the first conductive type (for example, an n-type) of the substrate 110. Thus, the emitter regions 121 of the second conductive type form a p-n junction along with the substrate 110 of the first conductive type. The emitter regions 121 may contain impurities of a group III element such as boron (B), gallium (Ga), and indium (In). The emitter regions 121 may be formed by heavily doping the substrate 110 with impurities (for example, p$^{++}$-type impurities) of the second conductive type through a diffusion process.

The plurality of BSF regions 122 are positioned at the back surface of the substrate 110 to be spaced apart from one another. The plurality of BSF regions 122 extend in the same direction as the plurality of emitter regions 121 (i.e., in the direction parallel to the emitter regions 121). Thus, as shown in FIGS. 1 and 2, the plurality of emitter regions 121 and the plurality of BSF regions 122 are alternately positioned at the back surface of the substrate 110.

Each of the BSF regions 122 is a region (for example, an n$^{++}$-type region) which is more heavily doped than the substrate 110 with impurities of the same conductive type as the substrate 110. The BSF regions 122 may be formed by heavily doping the substrate 110 with impurities (for example, n$^{++}$-type impurities) of the same conductive type as the substrate 110 through a diffusion process.

Accordingly, a potential barrier is formed by a difference between impurity concentrations of the substrate 110 and the plurality of BSF regions 122 in the same manner as the FSF region 171, thereby preventing carriers (for example, holes) moving to the BSF regions 122 from moving to the second electrodes 142. Hence, the recombination and/or the disappearance of electrons and holes around the second electrodes 142 is prevented or reduced.

A plurality of electron-hole pairs produced by light incident on the substrate 110 are separated into electrons and holes by a built-in potential difference resulting from the p-n junction between the substrate 110 and the emitter regions 121. Then, the separated electrons move to the n-type semiconductor, and the separated holes move to the p-type semiconductor. Thus, when the substrate 110 is of the n-type and the emitter regions 121 are of the p-type, the separated holes move to the emitter regions 121 and the separated electrons move to the BSF regions 122.

Because the emitter regions 120 form the p-n junction along with the substrate 110, the emitter regions 120 may be of the n-type when the substrate 110 is of the p-type unlike the embodiment described above. In this instance, the separated electrons move to the emitter regions 121 and the separated holes move to the BSF regions 122.

The back passivation layer 192 is positioned on a portion of each emitter region 121 and a portion of each BSF regions 122. The back passivation layer 192 may be formed of silicon oxide (SiO$_X$) in the same manner as the front passivation layer 191. However, other materials may be used. The back passivation layer 192 converts a defect, for example, dangling bonds existing at and around the back surface of the substrate 110 into stable bonds, thereby preventing or reducing a recombination and/or a disappearance of carriers moving to the back surface of the substrate 110.

The back passivation layer 192 may have a plurality of openings 1921 for exposing portions of the emitter regions 121 and portions of the BSF regions 122. The plurality of openings 1921 may have a stripe shape elongating along the emitter regions 121 and the BSF regions 122.

The first electrodes 141 are physically and electrically connected to the emitter regions 121 exposed through the openings 1921 and extend along the emitter regions 121.

The second electrodes 142 are physically and electrically connected to the BSF regions 122 exposed through the openings 1921 and extend along the BSF regions 122.

The first electrodes 141 are physically and electrically separated from the second electrodes 142 on the back surface of the substrate 110. The first electrodes 141 and the second electrodes 142 may be insulated from each other by the back passivation layer 192.

Accordingly, the first electrodes 141 respectively formed on the emitter regions 121 collect carriers (for example, holes) moving to the emitter regions 121. Further, the second electrodes 142 respectively formed on the BSF regions 122 collect carriers (for example, electrons) moving to the BSF regions 122.

As above, the holes collected by the first electrodes 141 and the electrons collected by the second electrodes 142 are used as electric power of an external device through an external circuit device.

An operation of the solar cell 1 according to the embodiment of the invention, in which the first electrodes 141 and the second electrodes 142 are positioned on the back surface of the substrate 110 on which light is not incident, is described below.

When light irradiated to the solar cell 1 sequentially passes through the anti-reflection layer 130, the front passivation layer 191, and the FSF region 171 and then is incident on the substrate 110, a plurality of electron-hole pairs are generated in the substrate 110 by light energy based on the incident light. In this instance, a reflectance of light incident on the front surface of the substrate 110 is reduced because of the textured front surface of the substrate 110. Further, because light incident and reflective operations are performed several times on the textured surface of the substrate 110, an absorptance of light increases. As a result, the efficiency of the solar cell 11 is improved. In addition, a reflection loss of light incident on the substrate 110 decreases because of the anti-reflection layer 130, and thus an amount of light incident on the substrate 110 further increases.

The electron-hole pairs are separated into electrons and holes by the p-n junction of the substrate 110 and the emitter regions 121, and the separated holes move to the p-type emitter regions 121 and the separated electrons move to the n-type BSF regions 122. The holes moving to the p-type emitter regions 121 are collected by the first electrodes 141, and the electrons moving to the n-type BSF regions 122 are collected by the second electrodes 142. When the first electrodes 141 are connected to the second electrodes 142 using electric wires, current flows therein to thereby enable use of the current for electric power.

In the embodiment of the invention, because the front passivation layer 191 and the back passivation layer 192 are respectively positioned on the front surface and the back surface of the substrate 110, an amount of carriers lost by unstable bonds existing around the front surface and the back surface of the substrate 110 is reduced. As a result, the efficiency of the solar cell 11 is improved.

Further, because the FSF region 171 heavily doped with impurities of the same conductive type as the substrate 110 is positioned at the front surface of the substrate 110 in addition to the back surface of the substrate 110, the movement of holes to the front surface and the back surface of the substrate 110 is prevented. Hence, the recombination and/or the disappearance of electrons and holes in the front surface and the back surface of the substrate 110 is prevented or reduced. As a result, the efficiency of the solar cell 11 is further improved.

The plurality of solar cells 1 having the above-described configuration may be used in a solar cell module and may be electrically connected in parallel or in series to one another through a plurality of connectors.

When the plurality of solar cells 1 are connected in series to one another, an output voltage output from the solar cell module including the plurality of solar cells 1 may increase. When the plurality of solar cells 1 are connected in parallel to one another, an output current output from the solar cell module may increase.

So far, the first embodiment of the invention described where the substrate 110 is the crystalline silicon substrate and the emitter regions 121 and the BSF regions 122 are formed through the diffusion process. On the other hand, a second embodiment of the invention will describe where the emitter regions 121 and the BSF regions 122 are formed through the deposition of amorphous silicon.

Further, the arrangement structure of the first and second electrodes 141 and 142 formed on the back surface of the substrate 110 in the second embodiment of the invention may be substantially the same as the first embodiment of the invention.

Figure 3:
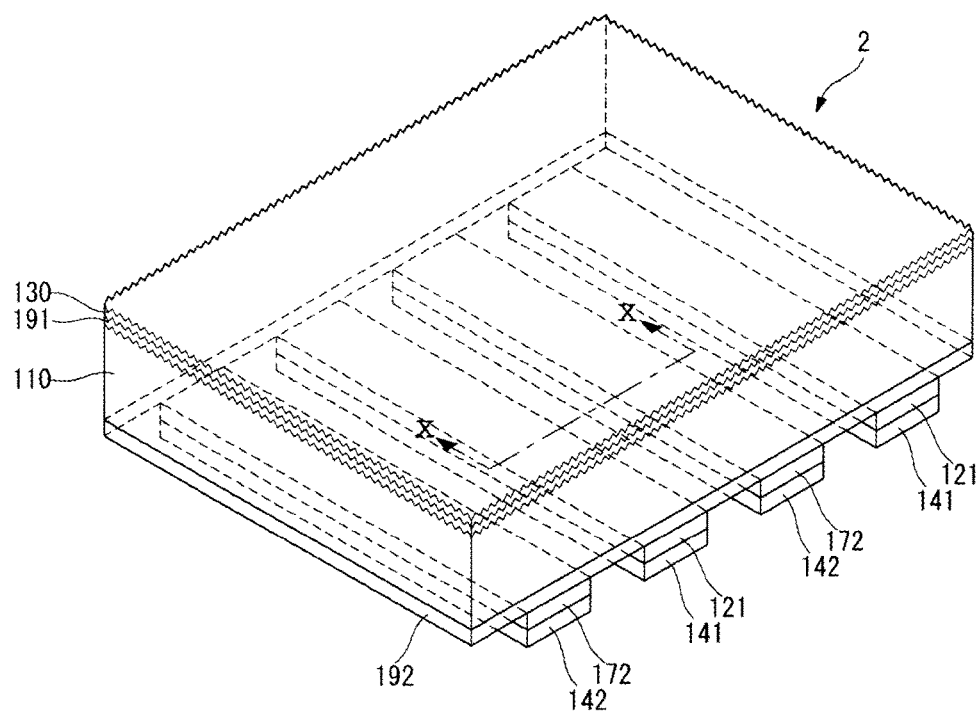
FIGS. 3 and 4 illustrate a solar cell according to a second embodiment of the invention.
Figure 4:
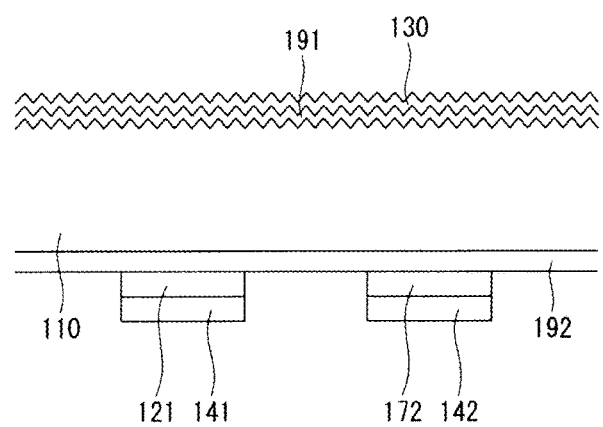

FIGS. 3 and 4 illustrate a solar cell according to a second embodiment of the invention. More specifically, FIG. 3 is a partial perspective view of the solar cell according to the second embodiment of the invention. FIG. 4 is a cross-sectional view taken along line X-X of FIG. 3.

As shown in FIGS. 3 and 4, a solar cell 2 according to the second embodiment of the invention may include a substrate 110, a front passivation layer 191, an anti-reflection layer 130, a back passivation layer 192, a plurality of emitter regions 121, a plurality of BSF regions 172, a plurality of first electrodes 141, and a plurality of second electrodes 142, similar to the first embodiment of the invention. Further, the solar cell 2 according to the second embodiment of the invention performs the similarly as the solar cell 1 according to the first embodiment of the invention.

Hereinafter, characteristics capable of distinguishing the solar cell 2 according to the second embodiment of the invention from the solar cell 1 according to the first embodiment of the invention are described. Accordingly, a description of the same configuration between the solar cells 1 and 2 according to the first and second embodiments of the invention may be briefly made or may be entirely omitted.

The substrate 110 may be a semiconductor substrate formed of first conductive type silicon, for example, n-type silicon, though not required. For example, the substrate 110 may be formed of crystalline silicon such as single crystal silicon and polycrystalline silicon. The substrate 110 has the same function as the substrate 110 according to the first embodiment of the invention.

The front passivation layer 191 formed on the front surface of the substrate 110 may be formed through the deposition of intrinsic amorphous silicon (a-Si) unlike the first embodiment of the invention. The front passivation layer 191 has the same function as the front passivation layer 191 according to the first embodiment of the invention.

The back passivation layer 192 positioned directly on the back surface of the substrate 110 may be formed through the deposition of intrinsic amorphous silicon in the same manner as the front passivation layer 191. The back passivation layer 192 has the same function as the back passivation layer 192 according to the first embodiment of the invention.

Unlike the first embodiment of the invention, the plurality of BSF regions 172 are formed at the back passivation layer 192 through a deposition process and are regions which is more heavily doped than the substrate 110 with impurities of the same conductive type as the substrate 110. Further, each of the BSF regions 172 may be a non-crystalline semiconductor formed of amorphous silicon, for example. The of BSF regions 172 have the same function as the BSF regions 122 according to the first embodiment of the invention.

Unlike the first embodiment of the invention, the plurality of emitter regions 121 are formed at the back passivation layer 192 through the deposition process and are spaced apart from the plurality of BSF regions 172. The plurality of emitter regions 121 are positioned parallel to the plurality of BSF regions 172.

As shown in FIGS. 3 and 4, the BSF regions 172 and the emitter regions 121 are alternately formed on the back surface of the substrate 110.

Each of the emitter regions 121 has a second conductive type (for example, a p-type) opposite the first conductive type of the substrate 110 and is formed of a semiconductor material, for example, amorphous silicon different from the substrate 110. Thus, the emitter regions 121 and the substrate 110 form a heterojunction as well as a p-n junction. Further, the emitter regions 121 have the same function as the emitter regions 121 according to the first embodiment of the invention.

As above, in the second embodiment of the invention, a crystallization phenomenon in the second embodiment, in which the emitter regions 121 and the BSF regions 172 are formed on the back passivation layer 192, is reduced compared to the first embodiment, in which the emitter regions 121 and the BSF regions 122 are formed directly on the substrate 110 formed of crystalline silicon, because the back passivation layer 192 is positioned between the back surface of the substrate 110 and lower parts of the emitter regions 121 and the BSF regions 172 and the back passivation layer 192 is formed of intrinsic amorphous silicon, in which impurities do not exist or little exist. Hence, characteristics of the emitter regions 121 and the BSF regions 172 positioned on the back passivation layer 192 formed of intrinsic amorphous silicon are improved.

Unlike the first embodiment of the invention, in the solar cell 2 according to the second embodiment of the invention, the front passivation layer 191, the back passivation layer 192, the emitter regions 121, and the BSF regions 172 may be formed by depositing amorphous silicon material on the substrate 110 formed of crystalline silicon.

The solar cell 2 according to the second embodiment of the invention may achieve a high opening output voltage due to the heterojunction between amorphous silicon having a relatively large energy bandgap and the crystalline silicon substrate 110, compared to the solar cell 1 according to the first embodiment of the invention. Further, the solar cell 2 according to the second embodiment of the invention may reduce its manufacturing cost because of a relatively low process temperature.

The first electrodes 141 are respectively positioned on the emitter regions 121, extend along the emitter regions 121, and are electrically connected to the emitter regions 121, similar to the first embodiment of the invention.

The second electrodes 142 are respectively positioned on the BSF regions 172, extend along the BSF regions 172, and are electrically and physically connected to the BSF regions 172, similar to the first embodiment of the invention.

As described above, the arrangement structures of the first and second electrodes 141 and 142 formed on the back surface of the substrate 110 in the first and second embodiments of the invention may be substantially the same as each other. The arrangement structure of the first and second electrodes 141 and 142 according to the embodiments of the invention is described in detail below.

Figure 5:
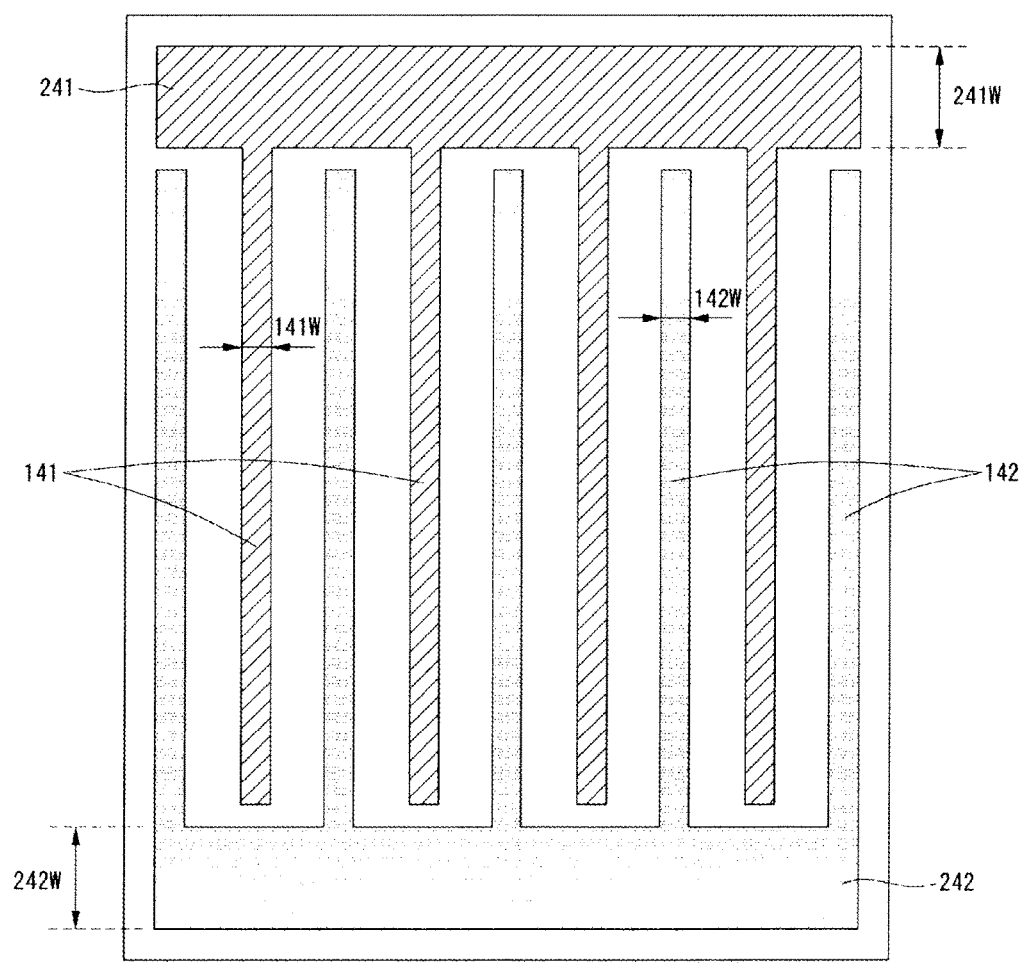
FIG. 5 illustrates an arrangement structure of first and second electrodes formed on a back surface of a solar cell according to an embodiment of the invention.

FIG. 5 illustrates the arrangement structure of the first and second electrodes formed on the back surface of the solar cell according to the embodiment of the invention.

As shown in FIG. 5, the solar cell shown in FIGS. 1 to 4 includes the first electrodes 141, the second electrodes 142, a first current collector 241, and a second current collector 242 on the back surface of the substrate.

As described above, the first electrodes 141 are positioned on back surfaces of the emitter regions and are electrically connected to the emitter regions. Further, the second electrodes 142 are positioned on back surfaces of the BSF regions and are electrically connected to the BSF regions.

The first current collector 241 is disposed at ends of the first electrodes 141 in a direction crossing the first electrodes 141 and connects the first electrodes 141 to one another, thereby making it easy to connect adjacent solar cells to one another. Further, a width 241W of the first current collector 241 may be greater than a width 141W of each of the first electrodes 141, so as to reduce a resistance.

Further, the second current collector 242 is disposed at ends of the second electrodes 142 in a direction crossing the second electrodes 142 and connects the second electrodes 142 to one another. A width 242W of the second collector 242 may be greater than a width 142W of each of the second electrodes 142 similar to the first current collector 241.

The first and second current collectors 241 and 242 may have different polarities. For example, if the first current collector 241 has a positive (+) polarity, the second current collector 242 may have a negative (−) polarity. On the contrary, if the first current collector 241 has a negative (−) polarity, the second current collector 242 may have a positive (+) polarity.

Accordingly, the first current collector 241 of the positive polarity in one solar cell is connected to the second current collector 242 of the negative polarity in another solar cell adjacent to the one solar cell, and thus the adjacent solar cells may be connected in series to each other.

This is described in detail below.

Figure 6A:
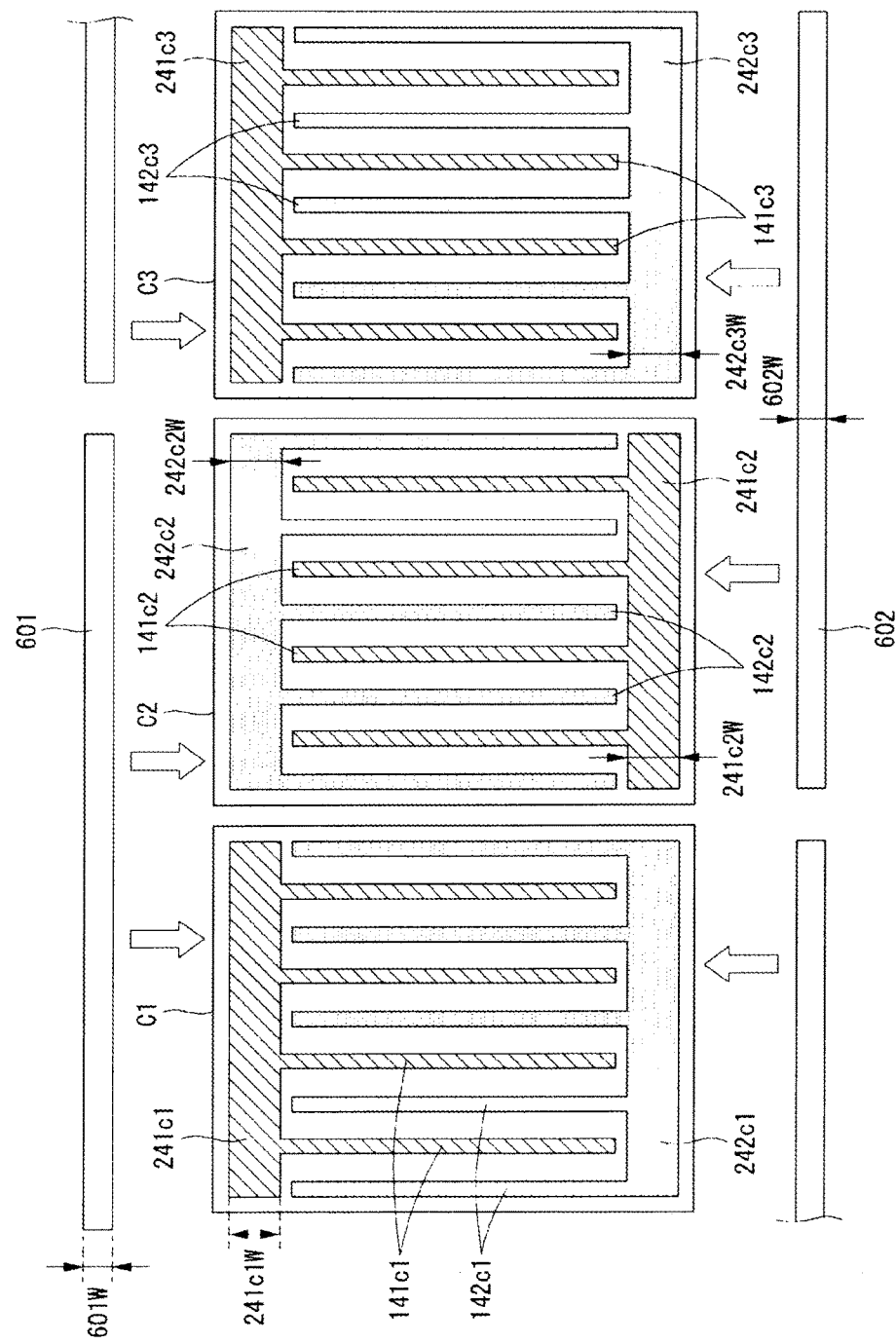
FIGS. 6A and 6B illustrate a solar cell module, in which a plurality of solar cells according to an embodiment of the invention are connected to one another.
Figure 6B:
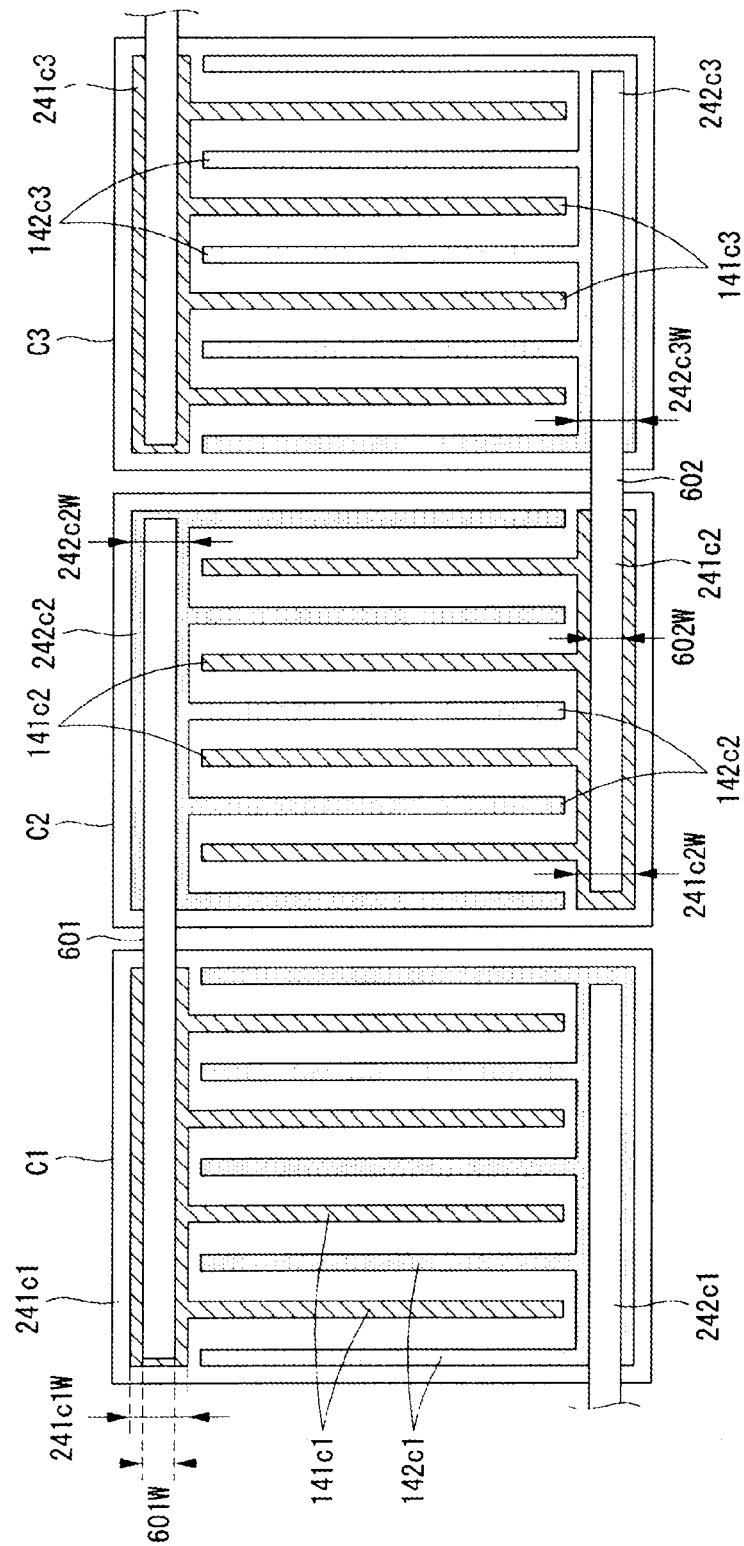

FIGS. 6A and 6B illustrate a solar cell module, in which the plurality of solar cells according to the embodiment of the invention are connected to one another.

First to third solar cells C1 to C3 shown in FIGS. 6A and 6B may use the solar cells shown in FIGS. 1 to 5 as an example.

As shown in FIGS. 6A and 6B, the first to third solar cells C1 to C3 are disposed in the order named.

More specifically, a first current collector 241c1 having a positive polarity in the first solar cell C1 and a second current collector 242c2 having a negative polarity in the second solar cell C2 are disposed parallel to each other. Further, a first current collector 241c2 having a positive polarity in the second solar cell C2 and a second current collector 242c3 having a negative polarity in the third solar cell C3 are disposed parallel to each other.

As shown in FIGS. 6A and 6B, a first connector 601 may overlap the first current collector 241c1 of the first solar cell C1 and the second current collector 242c2 of the second solar cell C2 in their longitudinal direction, so as to connect the first current collector 241c1 of the first solar cell C1 to the second current collector 242c2 of the second solar cell C2. Further, a second connector 602 may overlap the first current collector 241c2 of the second solar cell C2 and the second current collector 242c3 of the third solar cell C3 in their longitudinal direction, so as to connect the first current collector 241c2 of the second solar cell C2 to the second current collector 242c3 of the third solar cell C3.

Accordingly, the first to third solar cells C1 to C3 constituting the solar cell module according to the embodiment of the invention may be connected in series to one another through the first and second connectors 601 and 602.

The connection structure of the first to third solar cells C1 to C3 may be simplified by connecting the first and second connectors 601 and 602 to the current collectors of the first to third solar cells C1 to C3 in the longitudinal direction. Hence, the solar cell module may be manufactured through the simple manufacturing process. Further, because the first and second connectors 601 and 602 are connected to not the first and second electrodes having the relatively narrow width but the first and second current collectors having the relatively wide width, a contact resistance is reduced. Hence, the efficiency of the solar cell module may be improved.

Each of the first and second connectors 601 and 602 may a conductive film formed of a flexible material with electrical conductivity. Examples of the flexible material include a mixture of silver (Ag) with the high conductivity, lead (Pb) with excellent adhesive property, and tin (Sn) for the anti-oxidation; a material obtained by coating silver (Ag) on copper (Cu) with the high conductivity; and etc.

The first and second connectors 601 and 602 are disposed to overlap the current collectors of the solar cells C1 to C3 and then go through a thermal process, thereby being attached to the current collectors of the solar cells C1 to C3.

In the configuration illustrated in FIGS. 6A and 6B, each of the current collector and the connector has the uniform width. However, the current collector or the connector may include portions having different widths in consideration of the moving direction of carriers and the resistance of the connector.

More specifically, the current collector or the connector may include a portion having a relatively wide width and a portion having a relatively narrow width.

This is described in detail below.

Figure 7:
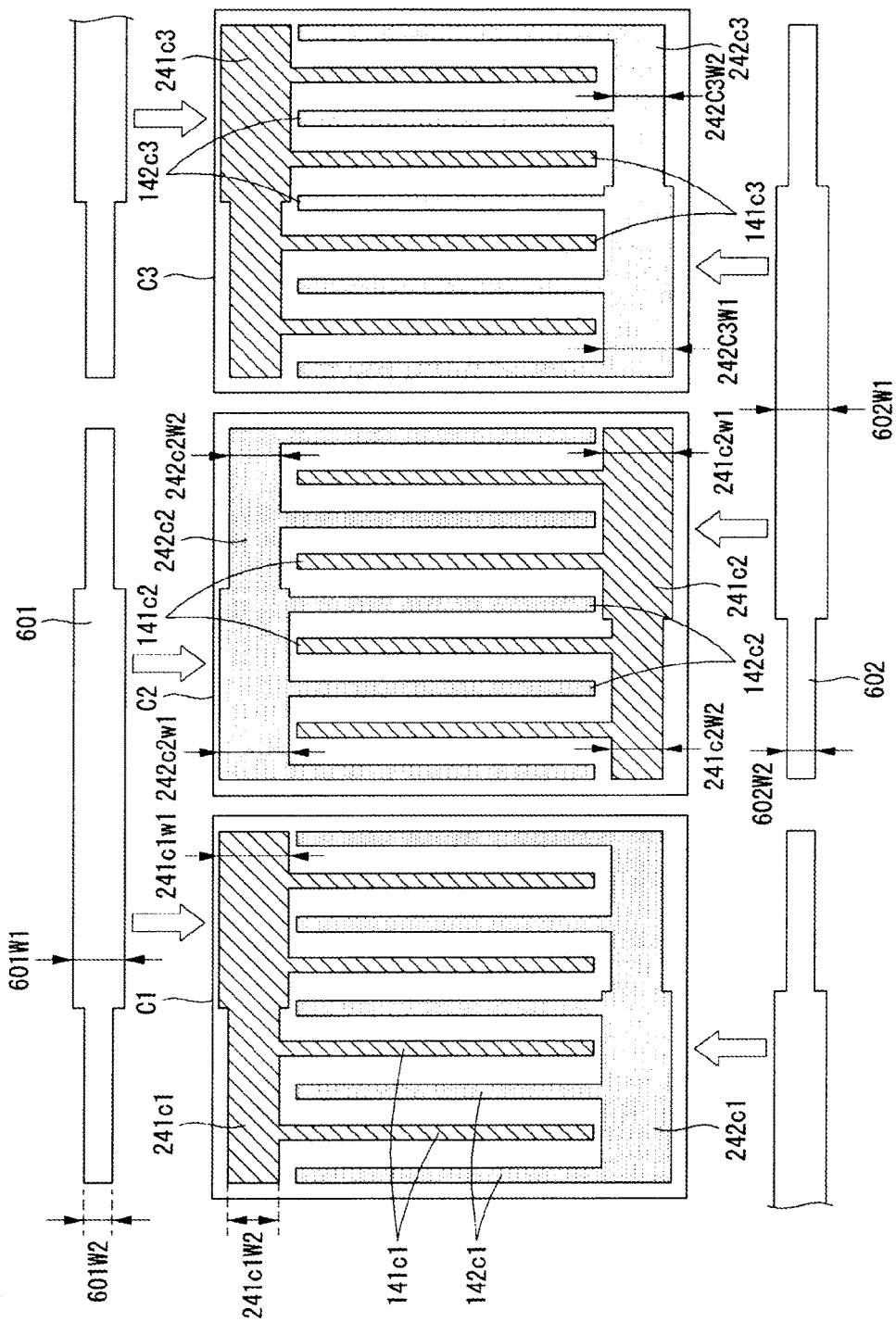
FIG. 7 illustrates a first example, in which each of a current collector and a connector includes portions having different widths in each of solar cells constituting a solar cell module according to an embodiment of the invention.

FIG. 7 illustrates a first example, in which each of a current collector and a connector includes portions having different widths in each of solar cells constituting a solar cell module according to the embodiment of the invention.

As shown in FIG. 7, in the first example, a width 241c1W1 of a first end, which is adjacent to a second current collector 242c2 of a second solar cell C2, among both ends of a first current collector 241c1 of a first solar cell C1 may be greater than a width 241c1W2 of a remaining second end of the first current collector 241c1 of the first solar cell C1. Further, a width 242c2W1 of a first end, which is adjacent to the first current collector 241c1 of the first solar cell C1, among both ends of the second current collector 242c2 of the second solar cell C2 may be greater than a width 242c2W2 of a remaining second end of the second current collector 242c2 of the second solar cell C2.

A width 601W1 of a middle portion of a first connector 601, which overlaps the first end of the first current collector 241c1 of the first solar cell C1 and the first end of the second current collector 242c2 of the second solar cell C2, may be greater than a width 601W2 of each of both ends of the first connector 601.

A width 241c2W1 of a first end of a first current collector 241c2 of the second solar cell C2 may be greater than a width 241c2W2 of a second end of the first current collector 241c2 of the second solar cell C2. Further, a width 242c3W1 of a first end of a second current collector 242c3 of a third solar cell C3 may be greater than a width 242c3W2 of a second end of the second current collector 242c3 of the third solar cell C3. A width 602W1 of a middle portion of a second connector 602 for connecting the second solar cell C2 to the third solar cell C3 may be greater than a width 602W2 of each of both ends of the second connector 602.

In the first example, a resistance of the first connector 601 may be further reduced by increasing a contact area of the middle portion of the first connector 601 contacting the first current collector 241c1 of the first solar cell C1 and the second current collector 242c2 of the second solar cell C2.

Further, the photoelectric conversion efficiency of the solar cell module may be further improved by increasing the width of the adjacent portions in each of the current collectors of each of the solar cells C1 to C3.

More specifically, in the first solar cell C1 as an example, carriers collected by first electrodes 141c1 of the first solar cell C1 are collected by the first current collector 241c1 of the first solar cell C1 and are conducted to the second solar cell C2 through the first connector 601.

In this instance, when the width of the first current collector 241c1 of the first solar cell C1 is uniform, the resistance and heat generation increase because the carriers is excessively collected in a portion of the second solar cell C2 adjacent to the first current collector 241c1. Hence, the photoelectric conversion efficiency of the solar cell module may be reduced.

However, in the embodiment of the invention, because the width 241c1W1 of the first end of the first current collector 241c1 of the first solar cell C1 is greater than the width 241c1W2 of the second end of the first current collector 241c1, the first end of the first current collector 241c1 having the relatively wide width 241c1W1 may reduce the resistance even if the carriers are excessively collected in the first end of the first current collector 241c1. Hence, the photoelectric conversion efficiency of the solar cell module may be improved.

FIG. 7 illustrates that the width 601W1 of the middle portion of the first connector 601 is greater than the width 601 W2 of each of both ends of the first connector 601. However, the width of the first connector 601 does not need to correspond to the width of the first current collector 241c1 and the width of the second current collector 242c2. For example, as shown in FIG. 6A, the width of the first connector 601 may be uniform in consideration of the manufacturing process efficiency of the solar cells and the first connector 601, whose the electrical conductivity is higher than the electrical conductivity of the first current collector 241c1 and the electrical conductivity of the second current collector 242c2.

Figure 8:
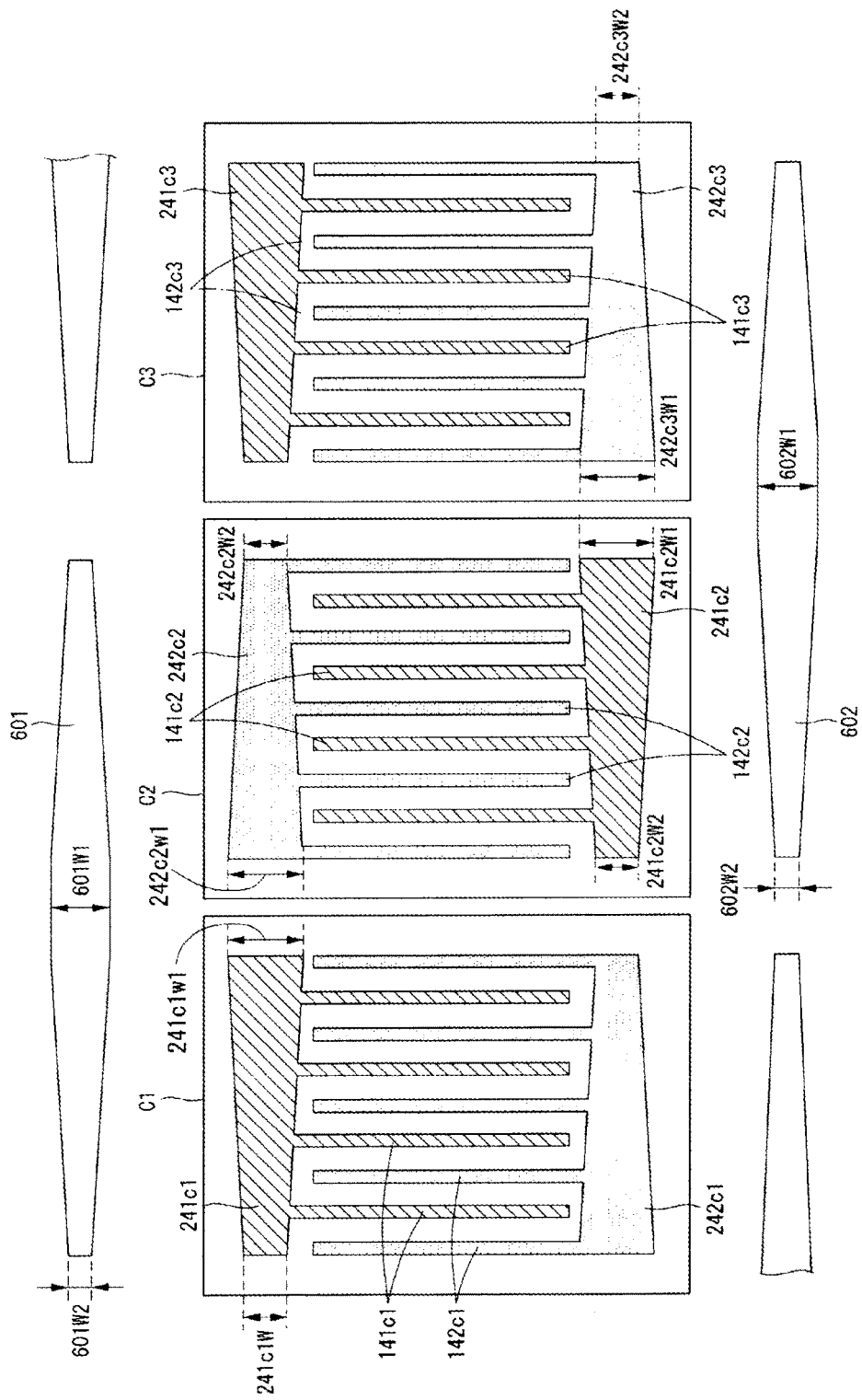
FIG. 8 illustrates a second example, in which each of a current collector and a connector includes portions having different widths in each of solar cells constituting a solar cell module according to an embodiment of the invention.

FIG. 8 illustrates a second example, in which each of a current collector and a connector includes portions having different widths in each of solar cells constituting a solar cell module according to the embodiment of the invention.

As shown in FIG. 8, as a first current collector 241c1 of a first solar cell C1 goes from a second end to a first end of the first current collector 241c1, a width of the first current collector 241c1 may gradually increase from 241c1W2 to 241c1W1. As a second current collector 242c2 of a second solar cell C2 goes from a second end to a first end of the second current collector 242c2, a width of the second current collector 242c2 may gradually increase from 242c2W2 to 242c2W1. As a first connector 601 goes from both ends to a middle portion of the first connector 601, a width of the first connector 601 may gradually increase from 601W2 to 601W1.

Further, as a first current collector 241c2 of the second solar cell C2 goes from a second end to a first end of the first current collector 241c2, a width of the first current collector 241c2 may gradually increase from 241c2W2 to 241c2W1. As a second current collector 242c3 of a third solar cell C3 goes from a second end to a first end of the second current collector 242c3, a width of the second current collector 242c3 may gradually increase from 242c3W2 to 242c3W1. As a second connector 602 goes from both ends to a middle portion of the second connector 602, a width of the second connector 602 may gradually increase from 602W2 to 602W1.

As described above with reference to FIG. 7, a contact resistance is reduced by increasing a contact area between the current collector and the connector in each of the solar cells through the above-described configuration illustrated in FIG. 8. Further, the resistance of the current collector is reduced.

FIG. 8 illustrates that the width 601W1 of the middle portion of the first connector 601 is greater than the width 601 W2 of each of both ends of the first connector 601. However, the embodiment of the invention is not limited thereto. For example, as shown in FIG. 6A, the width of the first connector 601 may be uniform.

As described above, in the embodiment of the invention, the first current collector 241c1 of the first solar cell C1 and the second current collector 242c2 of the second solar cell C2 each include a first portion having a relatively wide width and a second portion having a relatively narrow width. Further, the widths of the first portions adjacent to the first current collector 241c1 and the second current collector 242c2 may be greater than the widths of the second portions separated from the first current collector 241c1 and the second current collector 242c2 in consideration of the connection structure of the solar cells and the resistance.

In the embodiment of the invention, the first current collector 241c1 of the first solar cell C1 and the second current collector 242c2 of the second solar cell C2 each include a first portion having a relatively wide width and a second portion having a relatively narrow width. Further, in at least one solar cell of the plurality of solar cells, widths of portions of the first current collector electrically connected to the first electrodes may be greater than widths of portions of the first current collector, which are not electrically connected to the first electrodes. Alternatively, in the at least one solar cell, widths of portions of the second current collector electrically connected to the second electrodes may be greater than widths of portions of the second current collector, which are not electrically connected to the second electrodes.

Figure 9:
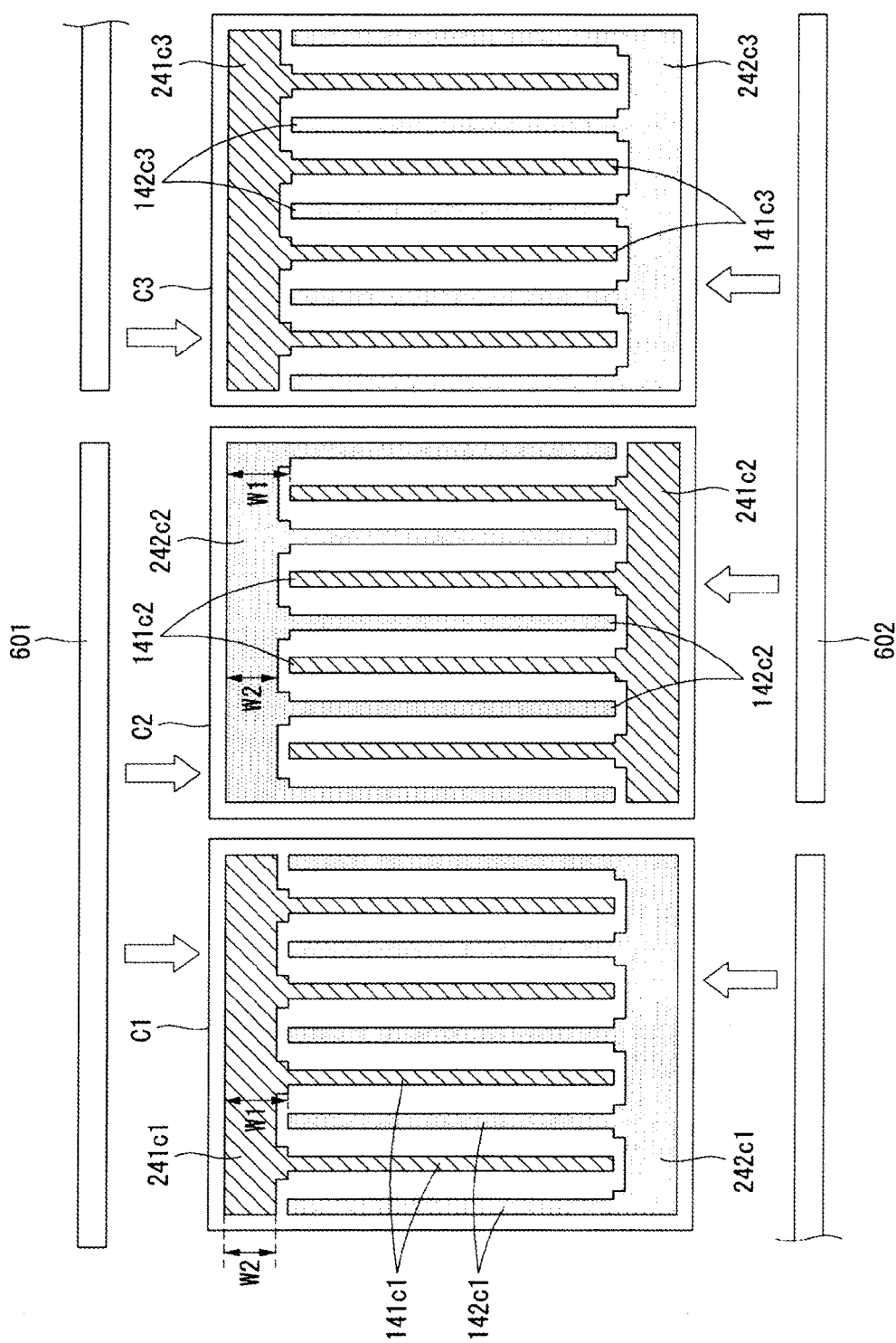
FIGS. 9 and 10 illustrate that a portion of a current collector connected to electrodes has a relatively wide width and a portion of the current collector not connected to the electrodes has a relatively narrow width.
Figure 10:
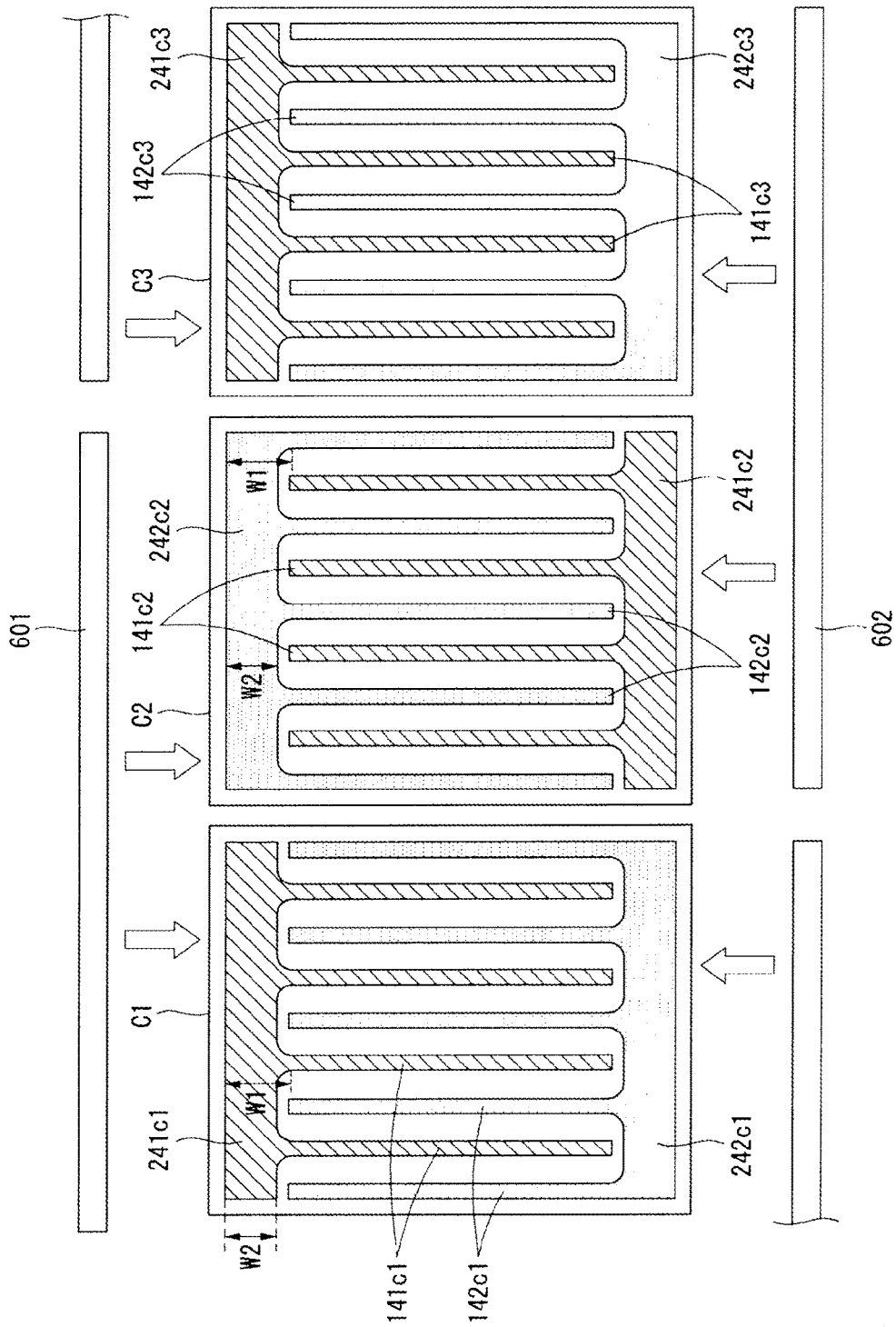

FIGS. 9 and 10 illustrate that a portion of a current collector connected to electrodes has a relatively wide width and a portion of the current collector not connected to the electrodes has a relatively narrow width.

As shown in FIG. 9, in the first, second, and third solar cells C1, C2, and C3, widths W1 of portions of the first current collectors 241c1, 241c2, and 241c3 respectively connected to the first electrodes 141c1, 141c2, and 141c3 may be greater than widths W2 of portions of the first current collectors 241c1, 241c2, and 241c3, which are not connected to the first electrodes 141c1, 141c2, and 141c3.

Further, in the first, second, and third solar cells C1, C2, and C3, widths W1 of portions of the second current collectors 242c1, 242c2, and 242c3 respectively connected to the second electrodes 142c1, 142c2, and 142c3 may be greater than widths W2 of portions of the second current collectors 242c1, 242c2, and 242c3, which are not connected to the second electrodes 142c1, 142c2, and 142c3.

As above, when the widths W1 of the first and second current collectors are greater than the widths W2 of the first and second current collectors, resistances of connection portions of the first and second electrodes and the first and second current collectors may be minimized in the movement of carriers collected by the first electrodes 141c1, 141c2, and 141c3 and the second electrodes 142c1, 142c2, and 142c3 to the first current collectors 241c1, 241c2, and 241c3 and the second current collectors 242c1, 242c2, and 242c3.

As a result, the carriers collected by the first electrodes 141c1, 141c2, and 141c3 and the second electrodes 142c1, 142c2, and 142c3 may be easier and efficiently collected by the first current collectors 241c1, 241c2, and 241c3 and the second current collectors 242c1, 242c2, and 242c3.

FIG. 9 illustrates that the widths W1 of the first and second current collectors are greater than the widths W2 of the first and second current collectors in all of the first, second, and third solar cells C1, C2, and C3. The configuration illustrated in FIG. 9 may be applied to some of the plurality of solar cells constituting the solar cell module.

As described above with reference to FIG. 9, the portion of the current collector connected to the electrodes has the relatively wide width, and the portion of the current collector not connected to the electrodes has the relatively narrow width. Further, in at least one of the plurality of solar cells, the portion of the first current collector or the second current collector electrically connected to the first electrodes or the second electrodes may have a curved surface, like as in FIG. 10.

More specifically, as described in FIG. 10, in the first, second, and third solar cells C1, C2, and C3, widths W1 of portions of the first current collectors 241c1, 241c2, and 241c3 respectively connected to the first electrodes 141c1, 141c2, and 141c3 may be greater than widths W2 of portions of the first current collectors 241c1, 241c2, and 241c3, which are not connected to the first electrodes 141c1, 141c2, and 141c3. Each of the first current collectors 241c1, 241c2, and 241c3 may have a curved surface in connection portions between each of the first current collectors and the first electrodes, as in FIG. 10. The second current collectors 242c1, 242c2, and 242c3 may have the same configuration and the curved surface as the first current collectors 241c1, 241c2, and 241c3.

When the first and second current collectors each have the curved surface, the resistance of the connection portions may be minimized and the consumption of the material of the electrodes irrespective of the moving direction of carriers may be minimized as described above with reference to FIG. 9. Hence, the manufacturing cost of the solar cell module may be further reduced.

Figure 11:
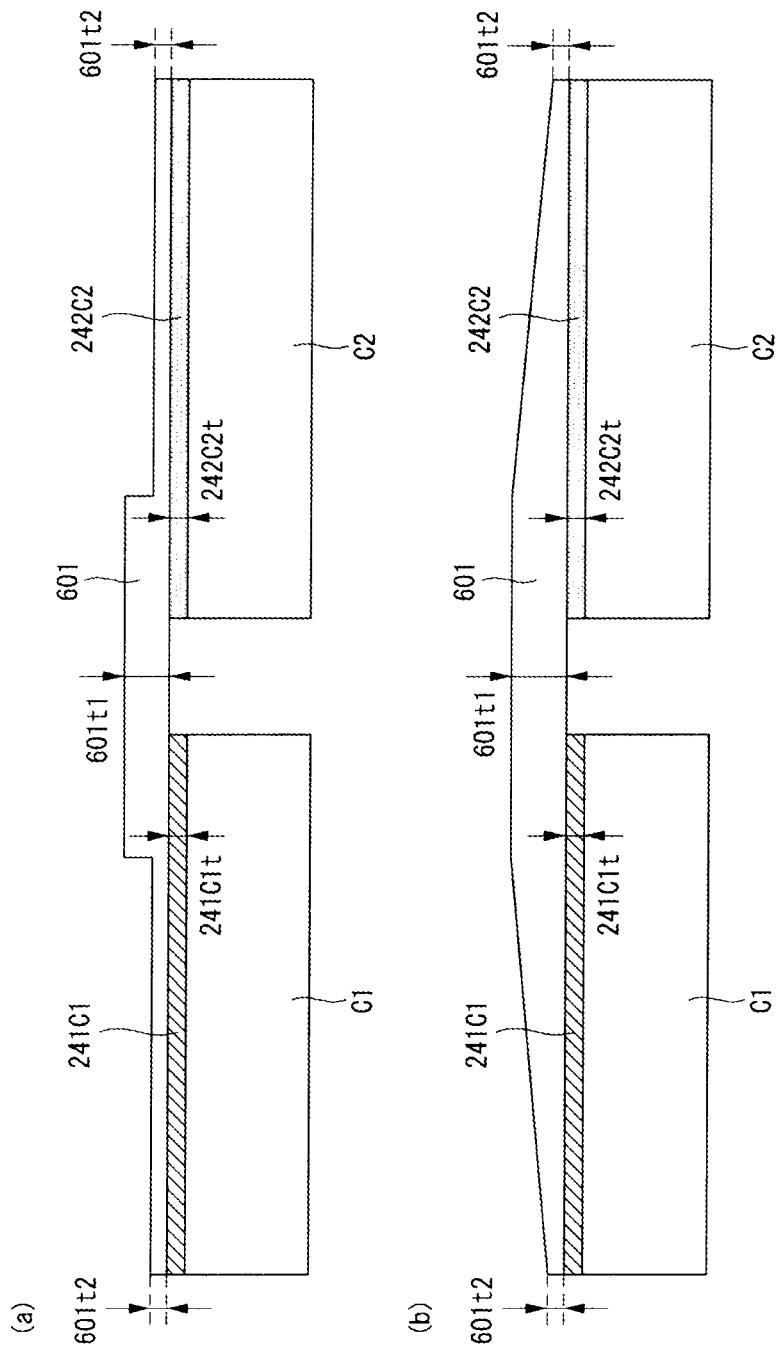
FIG. 11 illustrates that a connector includes portions having different thicknesses in a solar cell module according to an embodiment of the invention.

FIG. 11 illustrates that the connector includes portions having different thicknesses in the solar cell module according to the embodiment of the invention.

As shown in (a) and (b) of FIG. 11, a thickness 601t1 of the middle portion of the first connector 601 may be greater than a thickness 601t2 of each of both ends of the first connector 601. As shown in FIG. 11(a), a step may be generated in the middle portion of the first connector 601, so that the thickness 601t1 of the middle portion of the first connector 601 is greater than the thickness 601t2 of each of both ends of the first connector 601. Alternatively, as shown in FIG. 11(b), as the first connector 601 goes from both ends to the middle portion of the first connector 601, the thickness of the first connector 601 may gradually increase from 601t2 to 601t1.

Because an amount of carriers conducted to the middle portion of the first connector 601 may be more than an amount of carriers conducted to both ends of the first connector 601, the resistance of the middle portion may relatively increase. Therefore, an increase in the resistance of the middle portion may be prevented by an increase in the thickness of the middle portion of the first connector 601.

Figure 12:
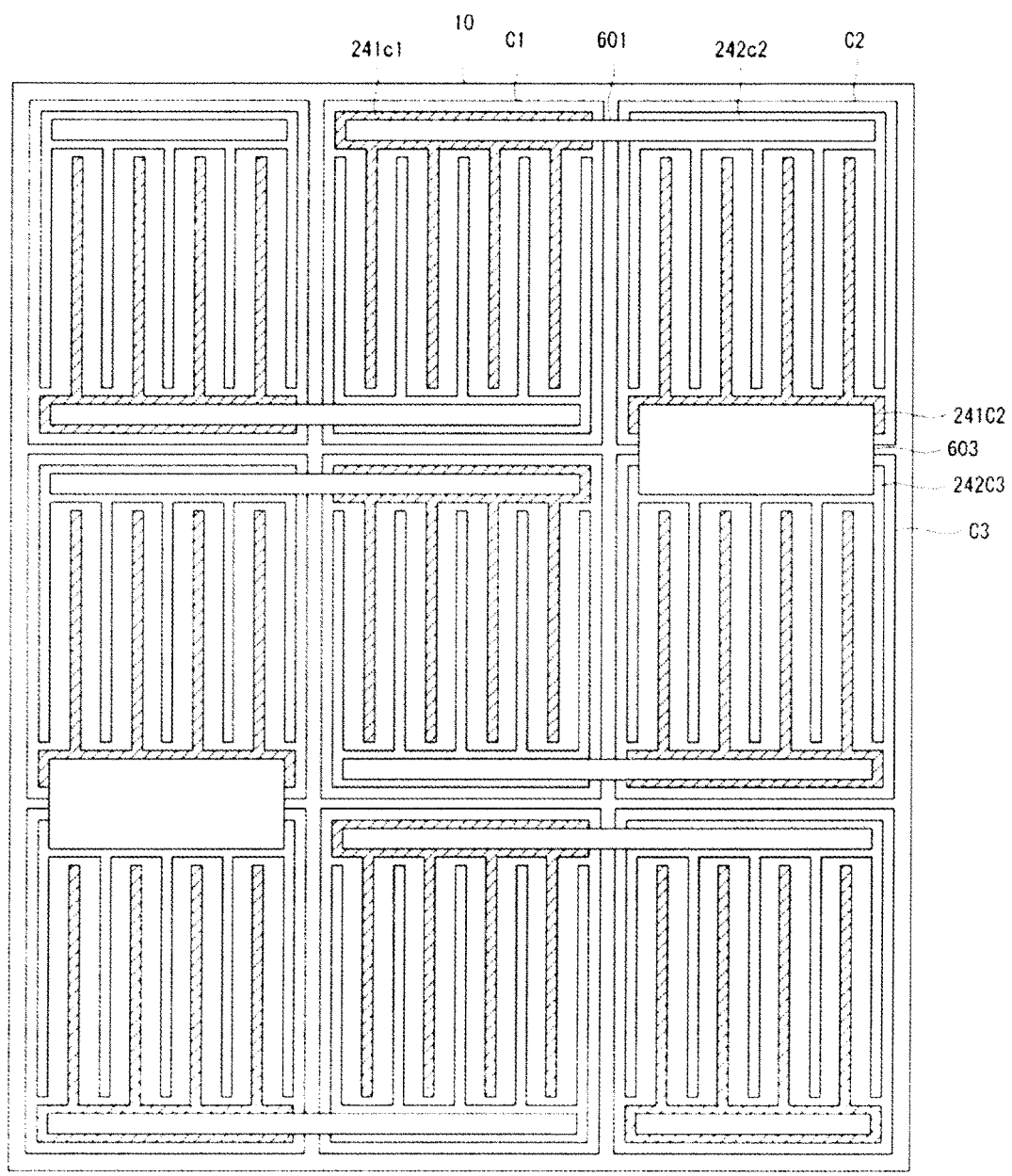
FIG. 12 illustrates the entire shape of a solar cell module according to an embodiment of the invention.

FIG. 12 illustrates the entire shape of the solar cell module according to the embodiment of the invention.

As shown in FIG. 12, when the plurality of solar cells, for example, the first and second solar cells C1 and C2 constituting the solar cell module according to the embodiment of the invention are disposed in a transverse direction, the first current collector 241c1 of the first solar cell C1 and the second current collector 242c2 of the second solar cell C2 may be disposed in a straight line.

Further, the connectors of the plurality of solar cells, for example, the first and second solar cells C1 and C2 may be disposed to overlap one another in a longitudinal direction of the current collectors, and thus the plurality of solar cells may be connected in series to one another.

Further, when the plurality of solar cells, for example, the second and the third solar cells C2 and C3 are disposed in a longitudinal direction, a third connector 603 may overlap and may be connected to the first current collector 241c2 of the second solar cell C2 and the second current collector 242c3 of the third solar cell C3 in a direction vertical to the longitudinal direction of the current collectors.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
a plurality of solar cells each including a substrate forming a p-n junction, a plurality of first electrodes of a first conductive type extended in a first direction on a back surface of the substrate, a plurality of second electrodes of a second conductive type which alternate with the first electrodes, extended in the first direction, and are separated from the first electrodes on the back surface of the substrate, wherein the plurality of solar cells comprising a first solar cell, a second solar cell adjacent to the first solar cell in a second direction crossing the first direction, and a third solar cell adjacent to the first solar cell in the first direction; and
a first connector electrically connecting the first solar cell and the second solar cell in the second direction;
a second connector electrically connecting the first solar cell and the third solar cell in the first direction,
wherein an arrangement of the plurality of first electrodes and the plurality of second electrodes is different from each other in the first solar cell and the second solar cell, and the first connector electrically connects the plurality of first electrodes of the first solar cell and the plurality of second electrode of the second solar cell in the second direction, wherein an arrangement of the plurality of first electrodes and the plurality of second electrodes is the same in the first solar cell and the third solar cell, and the second connector electrically connects the plurality of second electrodes of the first solar cell and the plurality of first electrode of the third solar cell in the first direction.

2. The solar cell module of claim 1, wherein a second current collector of the third solar cell and the first current collector of the second solar cell are in a straight line.

3. The solar cell module of claim 1, wherein the first connector is a conductive film.

4. The solar cell module of claim 3, wherein the first connector is a flexible material.

5. The solar cell module of claim 1, wherein the plurality of solar cells further include a fourth solar cell, which is adjacent to the first solar cell, and
wherein the solar cell module further includes a third connector to connect the second current collector of the first solar cell with the first current collector of the fourth solar cell.

6. The solar cell module of claim 1, wherein each of the plurality of solar cells further comprises a first current collector on the back surface of the substrate connecting the first electrodes, and a second current collector on the back surface of the substrate connecting the second electrodes.

7. The solar cell module of claim 6, wherein the first current collector is at one end of the first electrodes and the second current collector is at one end of the second electrodes.

8. The solar cell module of claim 6, wherein the first connector overlaps a first current collector of the first solar cell and a second current collector of the second solar cell in a longitudinal direction of the first current collector or the second current collector.

9. The solar cell module of claim 6, wherein at least one of the first current collector of the first solar cell and the second current collector of the second solar cell includes a portion having a first width and a portion having a second width less than the first width.

10. The solar cell module of claim 6, wherein a width of a first end of the first current collector of the first solar cell is greater than a width of a second end of the first current collector of the first solar cell.

11. The solar cell module of claim 10, wherein a width of the first current collector gradually increases from the second end to the first end.

12. The solar cell module of claim 10, wherein a width of a first end of the second current collector is greater than a width of a second end of the second current collector of the second solar cell.

13. The solar cell module of claim 12, wherein a width of the second current collector gradually increases from the second end to the first end.

14. The solar cell module of claim 13, wherein a width of a middle portion of the first connector, which overlaps the first end of the first current collector of the first solar cell and the first end of the second current collector of the second solar cell, is greater than a width of each ends of the first connector.

15. The solar cell module of claim 14, wherein a width of the first connector gradually increases from each end to the middle portion.

16. The solar cell module of claim 14, wherein a thickness of the middle portion of the first connector is greater than a thickness of each the ends of the first connector.

17. The solar cell module of claim 16, wherein a thickness of the first connector gradually increases from the ends to the middle portion.

18. The solar cell module of claim 6, wherein the plurality of solar cells further include a fourth solar cell, which is adjacent to the second solar cell in the second direction on an opposite side of the first solar cell.

19. The solar cell module of claim 18, further comprising a third connector, which overlaps the first current collector of the second solar cell and the second current collector of the third solar cell in a longitudinal direction.

20. The solar cell module of claim 6, wherein a width of a portion of the first current collector, which is connected to the first electrodes, in at least one of the plurality of solar cells is greater than a width of a portion of the first current collector, which is not connected to the first electrodes, or
a width of a portion of the second current collector, which is connected to the second electrodes, in the at least one solar cell is greater than a width of a portion of the second current collector, which is not connected to the second electrodes.

21. The solar cell module of claim 20, wherein the first current collector or the second current collector in at least one of the plurality of solar cells has a curved surface in a portion of the first current collector or the second current collector connected to the first electrodes or the second electrodes.

* * * * *